(12) United States Patent
Kim

(10) Patent No.: US 11,694,740 B2
(45) Date of Patent: *Jul. 4, 2023

(54) MEMORY DEVICE, MEMORY SYSTEM INCLUDING MEMORY DEVICE, AND METHOD OF OPERATING MEMORY DEVICE

(71) Applicant: SK hynix Inc., Icheon-si Gyeonggi-do (KR)

(72) Inventor: Jong Wook Kim, Icheon-si Gyeonggi-do (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/370,539

(22) Filed: Jul. 8, 2021

(65) Prior Publication Data

US 2022/0223190 A1 Jul. 14, 2022

(30) Foreign Application Priority Data

Jan. 11, 2021 (KR) .................. 10-2021-0003585

(51) Int. Cl.
*G11C 11/4072* (2006.01)
*G11C 11/408* (2006.01)
(Continued)

(52) U.S. Cl.
CPC .......... *G11C 11/4072* (2013.01); *G11C 5/063* (2013.01); *G11C 11/4074* (2013.01);
(Continued)

(58) Field of Classification Search
CPC ................ G11C 11/4072; G11C 5/063; G11C 11/4074; G11C 11/4076; G11C 11/4085;
(Continued)

(56) References Cited

U.S. PATENT DOCUMENTS 5,228,130 A 7/1993 Michael
6,154,821 A 11/2000 Barth et al.
(Continued)

FOREIGN PATENT DOCUMENTS

KR 101036720 B1 5/2011
KR 1020170129516 A 11/2017
(Continued)

OTHER PUBLICATIONS

256Gbit (32768 M x 8 bit) NAND Flash Memory, Preliminary H27UEG8YEA Series, Dec. 2009.

*Primary Examiner* — Fernando Hidalgo
(74) *Attorney, Agent, or Firm* — William Park & Associates Ltd.

(57) ABSTRACT

A memory device, a memory system including the memory device, and a method of operating the memory device are described. The memory device includes a memory cell array including a plurality of planes, a peripheral circuit configured to perform a read operation including a channel initialization operation on a selected memory block among a plurality of memory blocks included in each of the plurality of planes, and a control logic configured to control the peripheral circuit to perform the read operation including the channel initialization operation, and the control logic sets an activation time of the channel initialization operation based on an read mode of the read operation.

13 Claims, 10 Drawing Sheets

(51) Int. Cl.
  *G11C 5/06*        (2006.01)
  *G11C 11/4074*     (2006.01)
  *G11C 11/4076*     (2006.01)
  *G11C 11/4096*     (2006.01)

(52) U.S. Cl.
  CPC ...... *G11C 11/4076* (2013.01); *G11C 11/4085* (2013.01); *G11C 11/4096* (2013.01)

(58) Field of Classification Search
  CPC ............ G11C 11/4096; G11C 16/0483; G11C 2211/5642; G11C 7/1045; G11C 7/20; G11C 16/08; G11C 16/26; G11C 16/32; G11C 16/3427; G11C 16/20; G11C 16/30; G11C 8/08; G11C 7/12; G06F 3/0658; G06F 3/0679
  USPC ........................................................ 365/226
  See application file for complete search history.

(56) References Cited

U.S. PATENT DOCUMENTS

| | | |
|---|---|---|
| 2004/0160832 A1 | 8/2004 | Janzen et al. |
| 2005/0162934 A1 | 7/2005 | Roohparvar |
| 2006/0184782 A1 | 8/2006 | Zitlaw et al. |
| 2007/0214347 A1 | 9/2007 | Rothman et al. |
| 2009/0177946 A1 | 7/2009 | Dasari et al. |
| 2010/0070693 A1 | 3/2010 | Conley |
| 2012/0216059 A1* | 8/2012 | Barth .................. G11C 7/1072 713/320 |
| 2019/0214093 A1* | 7/2019 | An ........................ G06F 3/0604 |
| 2021/0090682 A1* | 3/2021 | Tokutomi ............ G11C 11/5642 |

FOREIGN PATENT DOCUMENTS

| | | | |
|---|---|---|---|
| KR | 1020190084518 A | | 7/2019 |
| KR | 20200064781 A | * | 6/2020 |
| KR | 1020210092060 A | | 7/2021 |

* cited by examiner

MEMORY DEVICE, MEMORY SYSTEM INCLUDING MEMORY DEVICE, AND METHOD OF OPERATING MEMORY DEVICE

CROSS-REFERENCE TO RELATED APPLICATION

The present application claims priority under 35 U.S.C. § 119(a) to Korean patent application number 10-2021-0003585, filed on Jan. 11, 2021, in the Korean Intellectual Property Office, the entire disclosure of which is incorporated herein by reference.

BACKGROUND

1. Technical Field

The present disclosure relates to a memory device, a memory system including the memory device, and a method of operating the memory device, and more particularly, to a memory device capable of improving a read disturb phenomenon, a memory system including the memory device, and a method of operating the memory device.

2. Related Art

Recently, a paradigm for a computer environment has been transformed into ubiquitous computing, which enables a computer system to be used whenever and wherever. Therefore, a use of a portable electronic device such as a mobile phone, a digital camera, and a notebook computer is rapidly increasing. Such a portable electronic device generally uses a memory system that uses a memory device, that is, a data storage device. The data storage device is used as a main storage device or an auxiliary storage device of the portable electronic device.

The data storage device using the memory device has advantages that stability and durability are excellent because there is no mechanical driver, an access speed of information is very fast, and power consumption is low. As an example of the memory system having such advantages, a data storage device includes a universal serial bus (USB) memory device, a memory card having various interfaces, a solid state drive (SSD), and the like.

SUMMARY

According to an embodiment of the present disclosure, a memory device may include a memory cell array including a plurality of planes, a peripheral circuit configured to perform a read operation including a channel initialization operation on a selected memory block among a plurality of memory blocks included in each of the plurality of planes, and control logic configured to control the peripheral circuit to perform the read operation including the channel initialization operation, and the control logic sets an activation time of the channel initialization operation based on an read mode of the read operation.

According to an embodiment of the present disclosure, a method of operating a memory device may include determining a read mode of a read operation based on a command received externally from the memory device, setting an activation time of a channel initialization operation based on the determined read mode, performing the channel initialization operation of the selected memory block during the set activation time, and applying a read voltage to the selected memory block after performing the channel initialization operation.

According to an embodiment of the present disclosure, a memory system may include a memory device including a plurality of semiconductor memories, and a memory controller configured to control a read operation of the memory device based on a read command received externally from the memory system. The memory controller may determine whether the read operation is an interleave read operation, a cache read operation, or a normal read operation based on the read command, and may set an activation time of a channel initialization operation of the read operation according to a determination result.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and should not be construed as being limited to the embodiments described in the present specification or application.

Hereinafter, embodiments of the present disclosure are described with reference to the accompanying drawings in order to describe in detail enough to allow those of ordinary skill in the art to implement the technical idea of the present disclosure.

An embodiment of the present disclosure may provide a memory device that adjusts a channel initialization period of strings according to a read mode, a memory system including the memory device, and a method of operating the memory device.

According to the present technology, a read disturb phenomenon may be improved and a read operation speed may be improved by adjusting a channel initialization period during a read operation based on a read mode.

Figure 1:
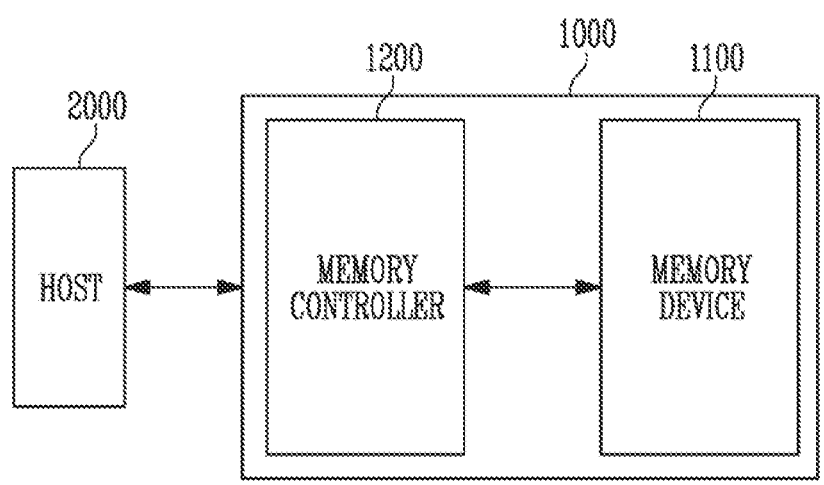
FIG. 1 is a diagram illustrating a memory system according to an embodiment of the present disclosure.

FIG. 1 is a diagram illustrating a memory system according to an embodiment of the present disclosure.

Referring to FIG. 1, the memory system 1000 includes a memory device 1100 in which data is stored, and a memory controller 1200 that controls the memory device 1100 under control of a host 2000.

The host 2000 may communicate with the memory system 1000 by using an interface protocol such as a peripheral component interconnect-express (PCI-E), an advanced technology attachment (ATA), a serial ATA (SATA), a parallel ATA (DATA), or a serial attached SCSI (SAS). In addition, the interface protocol between the host 2000 and the memory system 1000 is not limited to the above-described example, and may be one of other interface protocols such as a universal serial bus (USB), a multi-media card (MMC), an enhanced small disk interface (ESDI), and integrated drive electronics (IDE).

The memory controller 1200 may generally control an operation of the memory system 1000 and control a data exchange between the host 2000 and the memory device 1100. For example, the memory controller 1200 may control the memory device 1100 according to a request of the host 2000 to program or read data. According to an embodiment, the memory device 1100 may include a double data rate synchronous dynamic random access memory (DDR SDRAM), a low power double data rate4 (LPDDR4) SDRAM, a graphics double data rate (DDDR) SDRAM, a low power DDR (LPDDR), a Rambus dynamic random access memory (RDRAM), or a flash memory.

The memory device 1100 may perform a program, read, or erase operation under control of the memory controller 1200.

The memory device 1100 according to an embodiment of the present disclosure may set an activation time of a channel initialization period corresponding to a read mode based on a read command received from the memory controller 1200, and perform a channel initialization operation of removing a hot holes remaining in a channel of the selected memory block in the channel initialization period set during the read operation. For example, the memory device 1100 may set the channel initialization period to a first time based on a read command instructing a single plane read operation, and may set the channel initialization period to a second time longer than the first time based on a read command instructing a multi-plane read operation.

Figure 2:
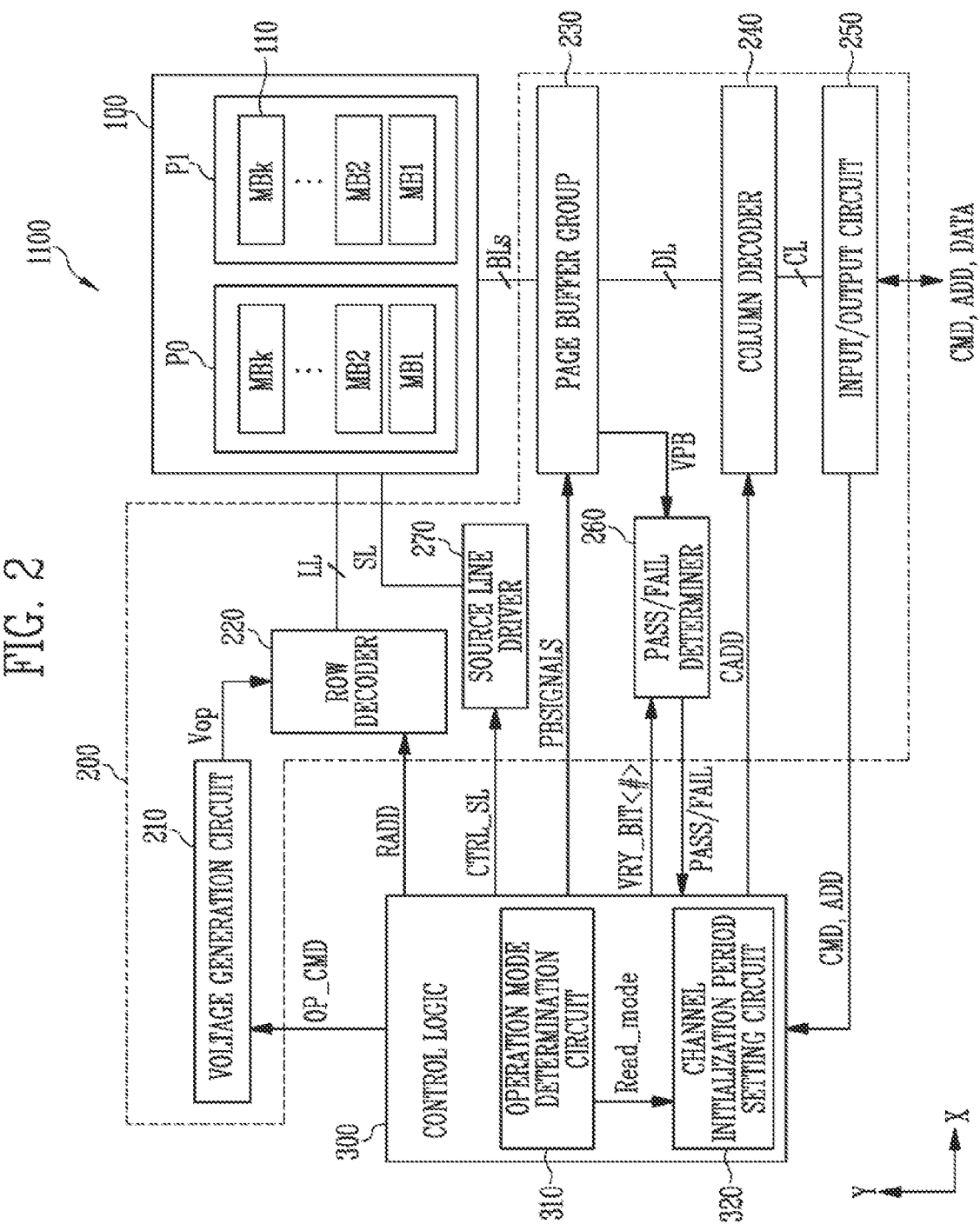
FIG. 2 is a diagram illustrating a memory device of FIG. 1.

FIG. 2 is a diagram illustrating the memory device of FIG. 1.

Referring to FIG. 2, the memory device 1100 may include a memory cell array 100 in which data is stored. The memory device 1100 may include a peripheral circuit 200 configured to perform a program operation for storing data in the memory cell array 100, a read operation for outputting the stored data, and an erase operation for erasing the stored data. The memory device 1100 may include control logic 300 that controls the peripheral circuit 200 according to the control of the memory controller 1200 of FIG. 1. The control logic 300 may be implemented as hardware, software, or a combination of hardware and software. For example, the control logic 300 may be a control logic circuit operating in accordance with an algorithm and/or a processor executing control logic code.

In an embodiment, the memory cell array 100 may include a plurality of planes P0 and P1. In FIG. 2, the first plane P0 and the second plane P1 are shown, but the disclosure is not limited to two planes and the memory cell array 100 may include two or more planes. Each of the plurality of planes P0 and P1 may include a plurality of memory blocks 110 (MB1 to MBk) (k is a positive integer). Local lines LL and bit lines BLs may be connected to each of the memory blocks 110 (MB1 to MBk). For example, the local lines LL may include a first select line, a second select line, and a plurality of word lines arranged between the first and second select lines. In addition, the local lines LL may include dummy lines arranged between the first select line and the word lines, and between the second select line and the word lines. Here, the first select line may be a source select line, and the second select line may be a drain select line. For example, the local lines LL may include the word lines, the drain and source select lines, and source lines. For example, the local lines LL may further include the dummy lines. For example, the local lines LL may further include pipe lines. The local lines LL may be connected to the memory blocks 110 (MB1 to MBk), respectively, and the bit lines BL1 to BLn (where N is a positive integer) may be commonly connected to the memory blocks 110 (MB1 to MBk). The memory blocks 110 (MB1 to MBk) may be implemented in a two-dimensional or three-dimensional structure. For example, the memory cells may be arranged in a direction parallel to a substrate in the memory block 110 of the two-dimensional structure. For example, the memory cells may be stacked in a direction perpendicular to the substrate in a memory block 110 of the three-dimensional structure. During the single plane read operation, one of the plurality of planes P0 and P1 may be selected and the read operation may be performed, and during the multi-plane read operation, at least two of the plurality of planes P0 and P1 may be selected and the read operation may be performed. For example, when the memory cell array includes four planes, during the single plane read operation, one plane may be selected and the read operation may be performed, and during the multi-plane read operation, at least two planes may be selected together and the read operation may be performed. During the multi-plane read operation, the read operations of each of the selected planes may overlap each other.

The peripheral circuit 200 may perform the program, read, and erase operations of the selected memory block 110 under control of the control logic 300. For example, the peripheral circuit 200 may include a voltage generation circuit 210, a row decoder 220, a page buffer group 230, a column decoder 240, an input/output circuit 250, a pass/fail determiner (pass/fail check circuit) 260, and a source line driver 270.

The voltage generation circuit 210 may generate various operation voltages Vop used in the program, read, and erase operations in response to an operation signal OP_CMD. In addition, the voltage generation circuit 210 may selectively discharge the local lines LL in response to the operation signal OP_CMD. For example, the voltage generation circuit 210 may generate a program voltage, a verify voltage, pass voltages, a turn on voltage, a read voltage, a source line voltage, and the like under the control of the control logic 300.

The row decoder 220 may transfer the operation voltages Vop to the local lines LL connected to the selected memory block 110 of the selected plane in response to a row address RADD.

The page buffer group 230 may include a plurality of page buffers connected to the bit lines BLs. The page buffer group 230 may operate in response to page buffer control signals PBSIGNALS. For example, the page buffer group 230 may temporarily store data to be programmed and received through data lines DL during the program operation, or may read data by sensing a voltage or a current of the bit lines BLs during the read operation, or a verify operation.

The column decoder 240 may transfer the data between the input/output circuit 250 and the page buffer group 230 in response to a column address CADD. For example, the column decoder 240 may exchange data with the page buffer group through the data lines DL, or may exchange the data with the input/output circuit 250 through column lines CL.

The input/output circuit 250 may transfer the command CMD and the address ADD received from the memory controller 1200 of FIG. 1 to the control logic 300 or may exchange the data DATA with the column decoder 240.

During the read operation or the verify operation, the pass/fail determiner 260 may generate a reference current in response to a permission bit VRY_BIT<#>, compare a sensing voltage VPB received from the page buffer group 230 with a reference voltage generated by the reference current, and output a pass signal PASS or a fail signal FAIL.

The source line driver 270 may be connected to the memory cell included in the memory cell array 100 through the source line SL and may control a voltage of a source node. For example, during the read operation or the verify operation, the source line driver 270 may electrically connect the source node of the memory cell to a ground node. In addition, during the program operation, the source line driver 270 may apply a ground voltage to the source node of the memory cell. During the erase operation, the source line driver 270 may apply an erase voltage to the source node of the memory cell. The source line driver 270 may receive a source line control signal CTRL_SL from the control logic 300 and may control the voltage of the source node based on the source line control signal CTRL_SL.

The control logic 300 may output the operation signal OP_CMD, the address RADD, the page buffer control signals PBSIGNALS, and the permission bit VRY_BIT<#> in response to the command CMD and the address ADD to control the peripheral circuit 200. In addition, the control logic 300 may determine whether the verify operation is passed or failed in response to the pass signal PASS or the fail signal FAIL.

When the read command CMD is received from the memory controller 1200 of FIG. 1, the control logic 300 may determine the read mode based on the read command CMD, and set the activation time of the channel initialization period according to the determined read mode.

The control logic 300 may include an operation mode determination circuit 310 and a channel initialization period setting circuit 320. The operation mode determination circuit 310 may receive the read command CMD corresponding to the read operation from the memory controller 1200 of FIG. 1, and generate and output a read mode signal Read_mode by determining whether the read operation to be performed is the single plane read operation or the multi-plane read operation based on the received read command CMD. The channel initialization period setting circuit 320 may set the activation time of the channel initialization period based on the read mode signal Read_mode. For example, when the read mode signal Read_mode indicates the single plane read operation, the channel initialization period setting circuit 320 may set the activation time of the channel initialization period to the first time that is a reference time, and when the read mode signal Read_mode indicates the multi-plane read operation, the channel initialization period setting circuit 320 may set the activation time of the channel initialization period to the second time longer than the first time. In addition, the channel initialization period setting circuit 320 may set the second time to be increased when the read mode signal Read_mode indicates the multi-plane read operation and as the number of selected planes increases. For example, the activation time of the channel initialization period during the multi-plane read operation in which three planes are selected together may be set to be longer than the activation time of the channel initialization period during the multi-plane read operation in which two planes are selected together, and the activation time of the channel initialization period during the multi-plane read operation in which four planes are selected together may be set to be longer than the activation time of the channel initialization period during the multi-plane read operation in which three planes are selected together.

Figure 3:
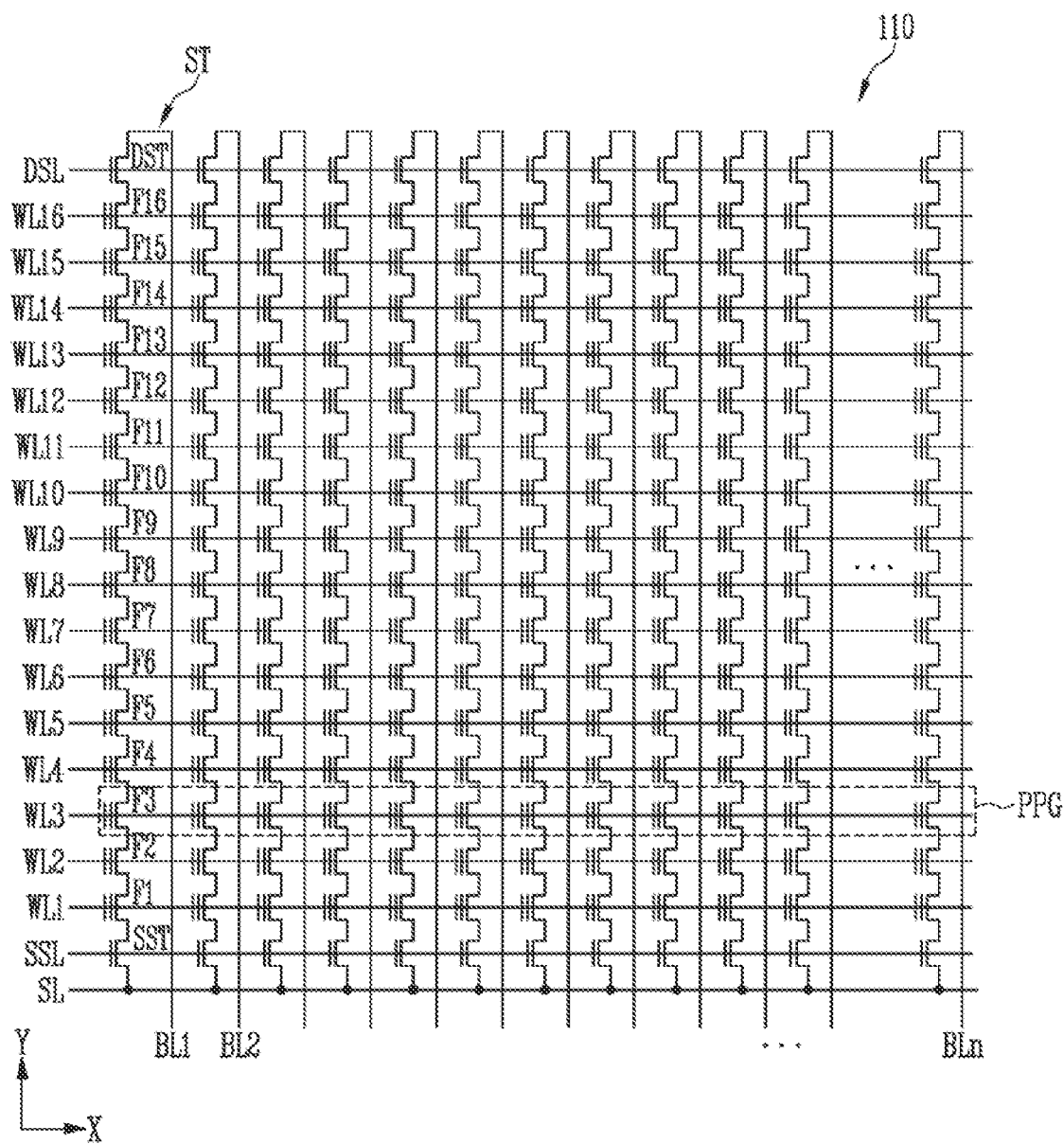
FIG. 3 is a diagram illustrating a memory block of FIG. 2.

FIG. 3 is a diagram illustrating the memory block of FIG. 2.

Referring to FIG. 3, the memory block 110 may be connected to a plurality of word lines arranged in parallel with each other between the first select line and the second select line. Here, the first select line may be the source select line SSL, and the second select line may be the drain select line DSL. For example, the memory block 110 may include a plurality of strings ST connected between the bit lines BL1 to BLn and the source line SL. The bit lines BL1 to BLn may be connected to the strings ST, respectively, and the source line SL may be commonly connected to the strings ST. Since the strings ST may be identical to each other, a string ST connected to the first bit line BL1 will be specifically described, as an example.

The string ST may include a source select transistor SST, a plurality of memory cells F1 to F16, and a drain select transistor DST connected in series between the source line SL and the first bit line BL1. One string ST may include at least one or more of the source select transistor SST and the drain select transistor DST, and may include the memory cells F1 to F16 more than the number shown in the figure.

A source of the source select transistor SST may be connected to the source line SL and a drain of the drain select transistor DST may be connected to the first bit line BL1. The memory cells F1 to F16 may be connected in series between the source select transistor SST and the drain select transistor DST. Gates of the source select transistors SST included in the different strings ST may be connected to the source select line SSL, gates of the drain select transistors DST may be connected to the drain select line DSL, and gates of the memory cells F1 to F16 may be connected to the plurality of word lines WL1 to WL16. A group of the memory cells connected to the same word line among the memory cells included in different strings ST may be referred to as a page PPG. Therefore, the memory block 110 may include the pages PPG of the number of the word lines WL1 to WL16.

One memory cell may store 1 bit of data. This is commonly called a single level cell (SLC). In this case, one physical page PPG may store one logical page (LPG) data. The one logical page (LPG) data may include data bits of the same number as cells included in one physical page PPG. In addition, one memory cell may store two or more bits of data. This is commonly called a multi-level cell (MLC). In this case, one physical page PPG may store two or more logical page (LPG) data.

Figure 4:
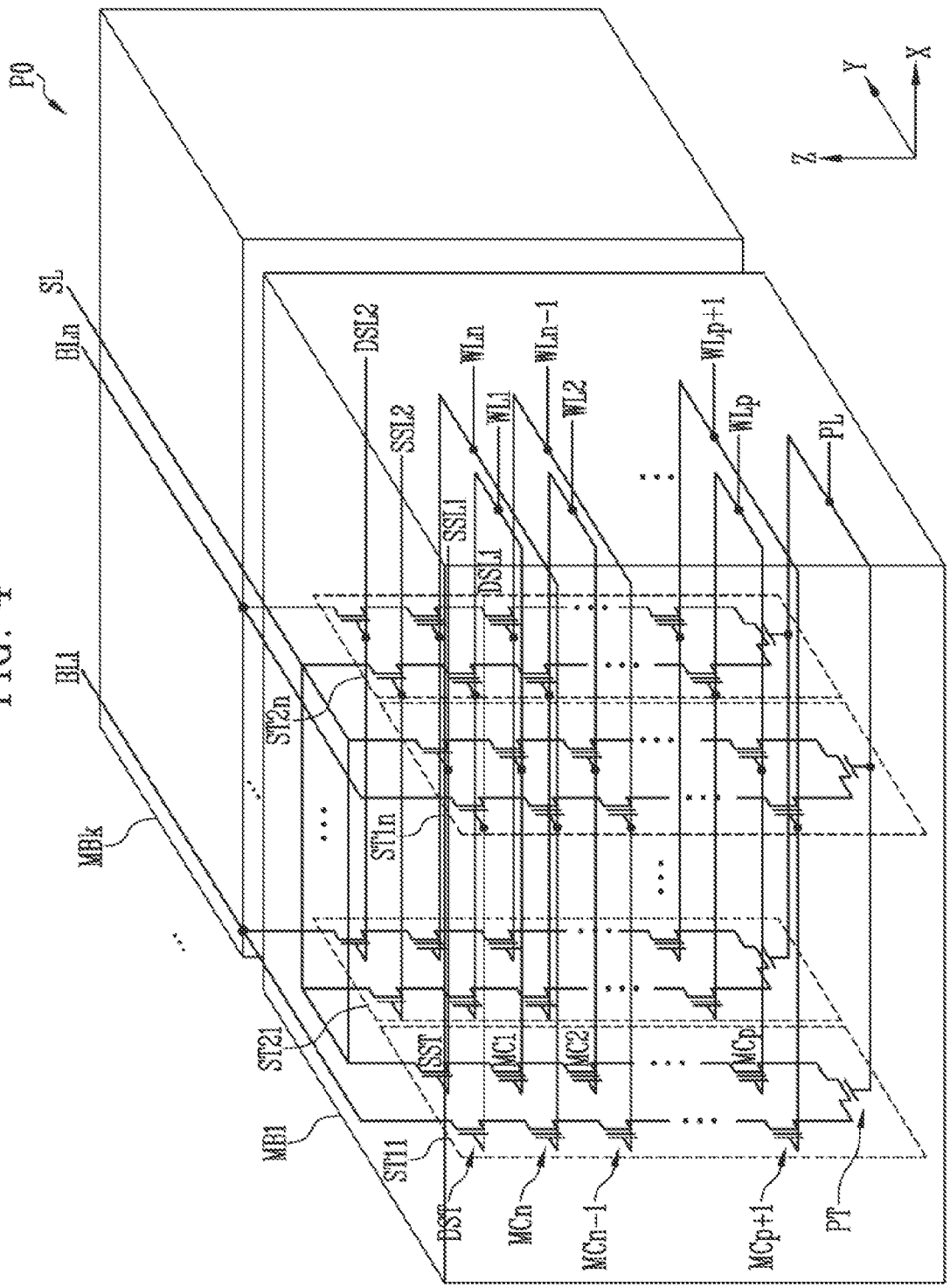
FIG. 4 is a diagram illustrating an embodiment of a memory block in a three-dimensional configuration in accordance with the present disclosure.

FIG. 4 is a diagram illustrating an embodiment of a memory block in a three-dimensional configuration in accordance with the present disclosure.

Since the first plane P0 and the second plane P1 of FIG. 2 have similar structures, the first plane P0 is described as an example.

Referring to FIG. 4, the first plane P0 may include a plurality of memory blocks 110 (MB1 to MBk). A memory block 110 may include a plurality of strings ST11 to ST1n and ST21 to ST2n. As an embodiment, each of the plurality of strings ST11 to ST1n and ST21 to ST2n may be formed in a shape. In the first memory block MB1, n strings may be arranged in a row direction (X direction). In FIG. 4, two strings are arranged in a column direction (Y direction), but this is for convenience of description, and three or more strings may be arranged in the column direction (Y direction).

Each of the plurality of strings ST11 to ST1n and ST21 to ST2n may include at least one source select transistor SST, first to n-th memory cells MC1 to MCn, a pipe transistor PT, and at least one drain select transistor DST.

The source and drain select transistors SST and DST and the memory cells MC1 to MCn may have similar structures. For example, each of the source and drain select transistors SST and DST and the memory cells MC1 to MCn may include a channel film, a tunnel insulating film, a charge trap film, and a blocking insulating film. For example, a pillar for providing the channel film may be provided in each string. For example, a pillar for providing at least one of the channel film, the tunnel insulating film, the charge trap film, and the blocking insulating film may be provided in each string.

The source select transistor SST of each string may be connected between the source line SL and the memory cells MC1 to MCp.

As an embodiment, the source select transistors of the strings arranged in the same row may be connected to the source select line extending in the row direction, and the source select transistors of the strings arranged in different rows may be connected to different source select lines. In FIG. 4, the source select transistors of the strings ST11 to ST1n of a first row may be connected to a first source select line SSL1. The source select transistors of the strings ST21 to ST2n of a second row may be connected to a second source select line SSL2.

As another embodiment, the source select transistors of the strings ST11 to ST1n and ST21 to ST2n may be commonly connected to one source select line.

The first to n-th memory cells MC1 to MCn of each string may be connected between the source select transistor SST and the drain select transistor DST.

The first to n-th memory cells MC1 to MCn may be divided into first to p-th memory cells MC1 to MCp and (p+1)-th to n-th memory cells MCp+1 to MCn, where p is a positive integer such that p is greater than or equal to 1 and less than or equal to n−1. The first to p-th memory cells MC1 to MCp may be sequentially arranged in a vertical direction (Z direction), and may be connected in series between the source select transistor SST and the pipe transistor PT. The (p+1)-th to n-th memory cells MCp+1 to MCn may be sequentially arranged in the vertical direction (Z direction), and may be connected in series between the pipe transistor PT and the drain select transistor DST. The first to p-th memory cells MC1 to MCp and the (p+1)-th to n-th memory cells MCp+1 to MCn may be connected to each other through the pipe transistor PT. Gates of the first to n-th memory cells MC1 to MCn of each string may be connected to the first to the n-th word lines WL1 to WLn, respectively.

As an embodiment, at least one of the first to n-th memory cells MC1 to MCn may be used as a dummy memory cell. When the dummy memory cell is provided, a voltage or a current of a corresponding string may be stably controlled. A gate of the pipe transistor PT of each string may be connected to the pipeline PL.

The drain select transistor DST of each string may be connected between the bit line and the memory cells MCp+1 to MCn. The strings arranged in the row direction may be connected to the drain select line extending in the row direction. The drain select transistors of the strings ST11 to ST1n of the first row may be connected to a first drain select line DSL1. The drain select transistors of the strings ST21 to ST2n of the second row may be connected to a second drain select line DSL2.

The strings arranged in the column direction may be connected to the bit lines extending in the column direction. In FIG. 4, the strings ST11 and ST21 of a first column may be connected to the first bit line BL1. The strings ST1n and ST2n of an n-th column may be connected to the n-th bit line BLn.

Among the strings arranged in the row direction, the memory cells connected to the same word line may configure one page. For example, the memory cells connected to the first word line WL1 among the strings ST11 to ST1n of the first row may configure one page. The memory cells connected to the first word line WL1 among the strings ST21 to ST2n of the second row may configure another page. The strings arranged in one row direction will be selected by selecting any one of the drain select lines DSL1 and DSL2. One page of the selected strings will be selected by selecting any one of the word lines WL1 to WLn.

Figure 5:
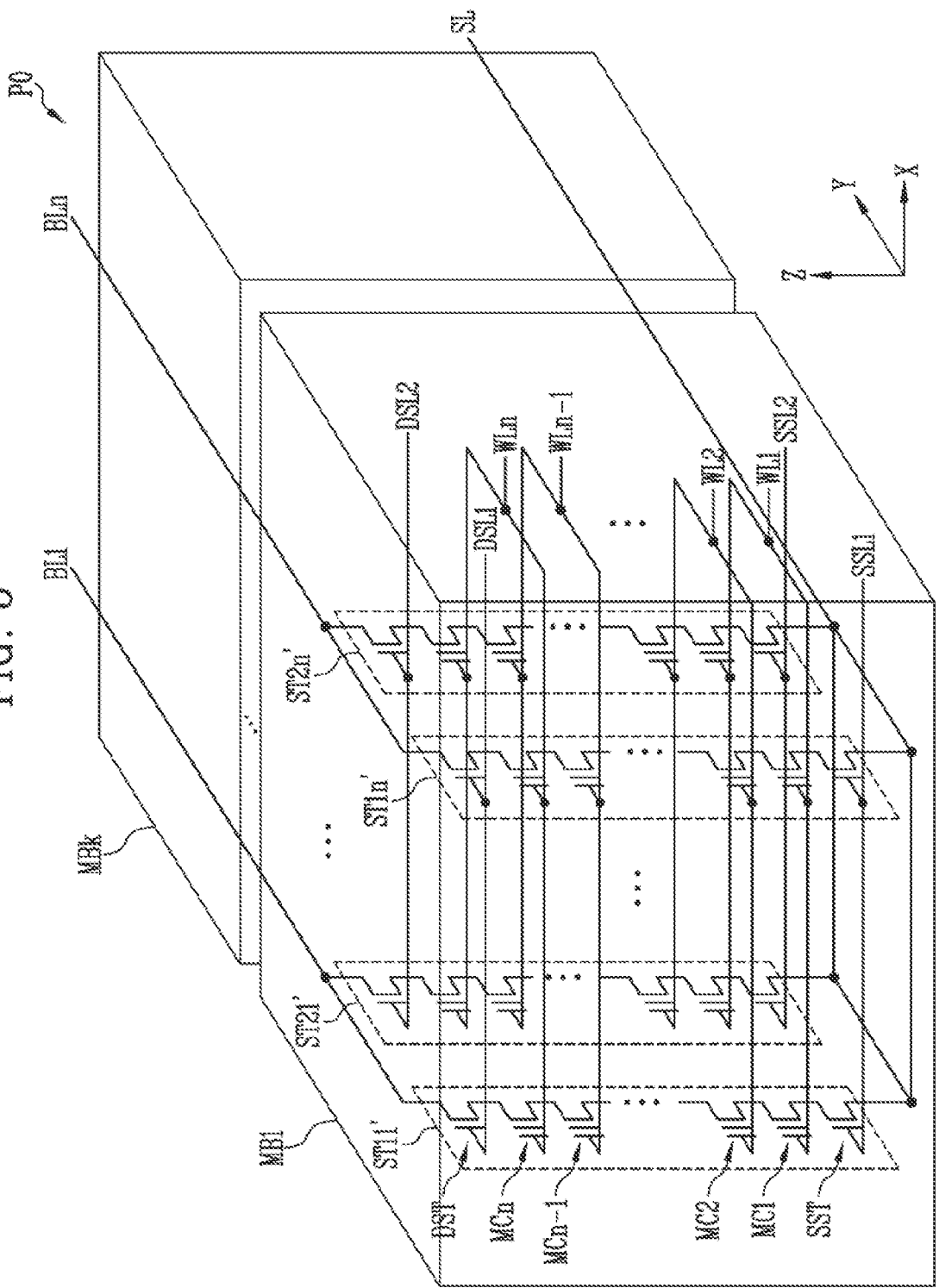
FIG. 5 is a diagram illustrating another embodiment of a memory block in a three-dimensional configuration in accordance with the present disclosure.

FIG. 5 is a diagram illustrating another embodiment of a memory block in a three-dimensional configuration in accordance with the present disclosure.

Since the first plane P0 and the second plane P1 of FIG. 2 have similar structures, the first plane P0 is described as an example.

Referring to FIG. 5, the memory cell array 100 may include a plurality of memory blocks 110 (MB1 to MBk). The memory block 110 may include a plurality of strings ST11' to ST1n' and ST21' to ST2n'. Each of the plurality of strings ST11' to ST1n' and ST21' to ST2n' may be extended along the vertical direction (Z direction). In the memory block 110, n strings may be arranged in the row direction (X direction). In FIG. 5, two strings are arranged in the column direction (Y direction), but this is for convenience of description, and three or more strings may be arranged in the column direction (Y direction).

Each of the plurality of strings ST11' to ST1n' and ST21' to ST2n' may include at least one source select transistor SST, first to n-th memory cells MC1 to MCn, and at least one drain select transistor DST.

The source select transistor SST of each string may be connected between the source line SL and the memory cells MC1 to MCn. The source select transistors of the strings arranged in the same row may be connected to the same source select line. The source select transistors of the strings ST11' to ST1n' arranged in the first row may be connected to a first source select line SSL1. The source select transistors of the strings ST21' to ST2n' arranged in the second row may be connected to a second source select line SSL2. As another embodiment, the source select transistors of the strings ST11' to ST1n' and ST21' to ST2n' may be commonly connected to one source select line.

The first to n-th memory cells MC1 to MCn of each string may be connected to each other in series between the source select transistor SST and the drain select transistor DST. Gates of the first to n-th memory cells MC1 to MCn may be connected to the first to n-th word lines WL1 to WLn, respectively.

As an embodiment, at least one of the first to n-th memory cells MC1 to MCn may be used as a dummy memory cell. When the dummy memory cell is provided, a voltage or a current of a corresponding string may be stably controlled. Therefore, reliability of the data stored in the memory block 110 may be improved.

The drain select transistor DST of each string may be connected between the bit line and the memory cells MC1 to MCn. The drain select transistors DST of the strings arranged in the row direction may be connected to the drain select line extending in the row direction. The drain select transistors DST of the strings ST11' to ST1n' of the first row may be connected to a first drain select line DSL1. The drain select transistors DST of the strings ST21' to ST2n' of the second row may be connected to a second drain select line DSL2.

That is, the memory block 110 of FIG. 5 may have an equivalent circuit similar to that of the memory block 110 of FIG. 4 except that the pipe transistor PT is excluded from each string.

The plurality of memory blocks MB1 to MBk of FIGS. 4 and 5 may share the source line SL.

Figure 6:
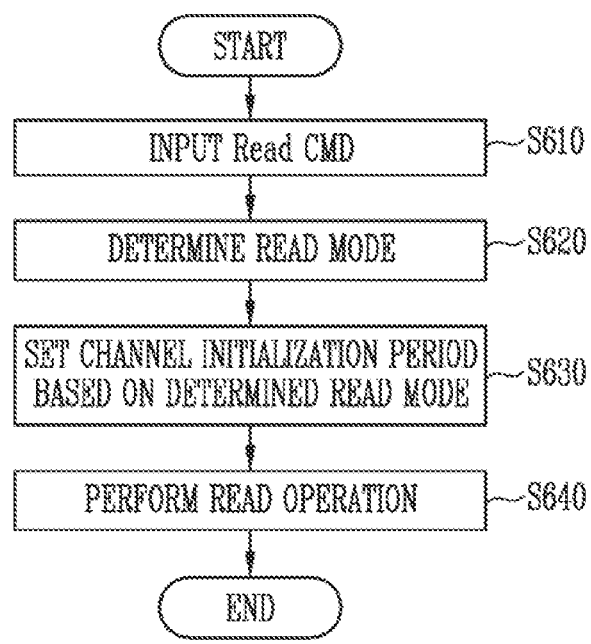
FIG. 6 is a flowchart illustrating a read operation of a memory system according to an embodiment of the present disclosure.

FIG. 6 is a flowchart illustrating a read operation of a memory system according to an embodiment of the present disclosure.

Figure 7:
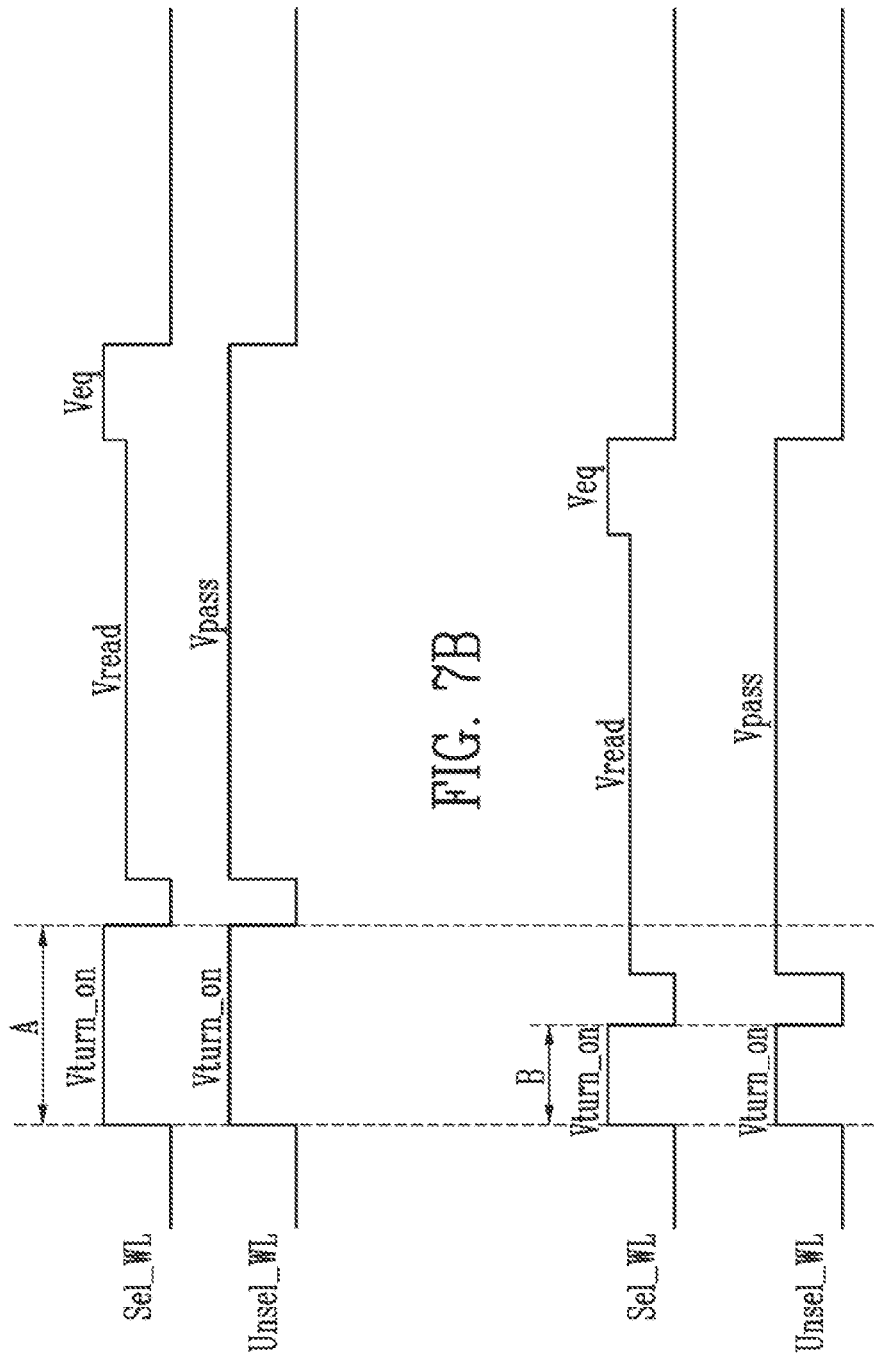
FIGS. 7A and 7B are voltage waveform diagrams illustrating a read operation of a memory system according to an embodiment of the present disclosure.

FIGS. 7A and 7B are voltage waveform diagrams illustrating a read operation of a memory system according to an embodiment of the present disclosure.

The read operation of the memory system according to an embodiment of the present disclosure is described with reference to FIGS. 1 to 7B as follows.

In step S610, when a read command Read CMD is input from the host 2000, the memory controller 1200 generates a command CMD for controlling the read operation of the memory device 1100 in response to the read command Read CMD, and generates a converted address ADD by converting an address received together with the read command Read CMD into an address of the memory device 1100. The memory controller 1200 outputs the command CMD corresponding to the read operation and the converted address ADD to the memory device 1100.

In step S620, the control logic 300 of the memory device 1100 determines the read mode based on the command CMD received from the memory controller 1200. For example, the operation mode determination circuit 310 of the control logic 300 may receive the command CMD corresponding to the read operation from the memory controller 1200, and generate the read mode signal Read_mode by determining whether the read operation to be performed is the single plane read operation or the multi-plane read operation, based on the received command CMD.

In step S630, the control logic 300 sets the channel initialization period according to the determined read mode. For example, the channel initialization period setting circuit 320 of the control logic 300 may set the activation time of the channel initialization period to the first time B of FIG. 7B that is the reference time when the read mode signal Read_mode indicates the single plane read operation, and set the activation time of the channel initialization period to the second time A of FIG. 7A when the read mode signal Read_mode indicates the multi-plane read operation. In addition, the channel initialization period setting circuit 320 may set the second time to be increased when the read mode signal Read_mode indicates the multi-plane read operation and as the number of selected planes increases. For example, the activation time of the channel initialization period during the multi-plane read operation in which three planes are selected together may be set to be longer than the activation time of the channel initialization period during the multi-plane read operation in which two planes are selected together, and the activation time of the channel initialization period during the multi-plane read operation in which four planes are selected together may be set to be longer than the activation time of the channel initialization period during the multi-plane read operation in which three planes are selected together.

In step S640, the read operation on the selected memory block of the selected plane is performed.

The read operation is described as follows.

The plurality of memory blocks may be designed to share the word lines and the source line. Accordingly, during the program, read, or erase operation of the selected memory block among the plurality of memory blocks, an operation voltage may be applied to the word lines and the source select line of an unselected memory block, and thus a hot hole may occur and remain in a channel of a memory string included in the unselected memory block. During the read operation, the hot hole remaining in the channel may cause a read disturb phenomenon. Accordingly, during the read operation, the channel initialization operation of removing the hot hole remaining in the channel may be performed in the channel initialization period.

The voltage generation circuit 210 generates and outputs a turn-on voltage Vturn_on during the channel initialization period set by the channel initialization period setting circuit 320 in response to the operation signal OP_CMD, and the row decoder 220 applies the turn-on voltage Vturn_on generated by the voltage generation circuit 210 to the source select line SSL, the drain select line DSL, and all word lines WL1 to WL16 of the selected memory block (for example, MB1). Accordingly, the source select transistor SST, the plurality of memory cells F1 to F16, and the drain select transistor DST of the selected memory block MB1 are turned on, and the channel of the selected memory block MB1 is electrically connected to the source line SL of a ground voltage level. Therefore, the hot holes in the channel of the selected memory block MB1 are removed.

During the read operation of the memory device 1100, an amount of a consumed current of the multi-plane read operation may be greater than that of the single plane read operation. Accordingly, a power voltage of the memory system may drop during the multi-plane read operation, and when the power voltage drops, the hot holes in the channel might not be smoothly removed during the channel initialization period in the read operation. Accordingly, during the multi-plane read operation ((A) of FIG. 7A), the channel initialization period may be set to the second time A longer than the first time B, which is the time of the channel initialization period of the single plane read operation, and an operation of initializing the channel of the memory strings of the selected memory block of the selected planes may be performed, to improve the read disturb phenomenon.

On the other hand, when the channel initialization period increases, a problem that an overall read operation speed is slowed occurs. Accordingly, during the single plane read operation ((B) of FIG. 7B), the channel initialization period may be set to the first time B of FIG. 7B shorter than the second time A, and the operation of initializing the channel of the memory strings of the selected memory block of the selected planes may be performed, to improve read operation speed.

After the channel initialization period, the voltage generation circuit 210 generates a read voltage Vread and a pass voltage Vpass in response to the operation signal OP_CMD. The roan decoder 220 applies the read voltage Vread generated by the voltage generation circuit 210 to a selected word line Sel_WL among the plurality of word lines, and applies the pass voltage Vpass generated by the voltage generation circuit 210 to an unselected word line Unsel_WL among the plurality of word lines.

The page buffer group 230 senses a potential level or a current amount of corresponding bit lines BLs while the read voltage Vread is applied, senses data programmed in the memory cells included in the selected page, and temporarily stores the data. The temporarily stored data is output to the memory controller 1200 through the column decoder 240 and the input/output circuit 250.

After applying the read voltage Vread for a predetermined time, the voltage generation circuit 210 generates an equalizing voltage Veq in response to the operation signal OP_CMD. The row decoder 220 applies the equalizing voltage Veq generated by the voltage generation circuit 210 to the selected word line Sel_WL, and then discharges the selected word line Sel_WL and the unselected word line Unsel_WL after a certain period of time. The equalizing voltage Veq may be at the same potential level as the pass voltage Vpass. Accordingly, the selected word line Sel_WL and the unselected word line Unsel_WL may be discharged from the same potential level to the same level during the same discharge time. The word "predetermined" as used herein with respect to a parameter, such as a predetermined time, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

According to the embodiment of the present disclosure described above, the read operation may be performed by setting the channel initialization period to be relatively short during the single plane read operation in the read operation of the selected memory block, and setting the channel initialization period to be relatively long during the multi-plane read operation. Accordingly, the read disturb phenomenon may be improved by effectively removing the hot holes in the channel of the selected memory block in the channel initialization period, and a problem that the read operation speed slowed may be improved.

Figure 8:
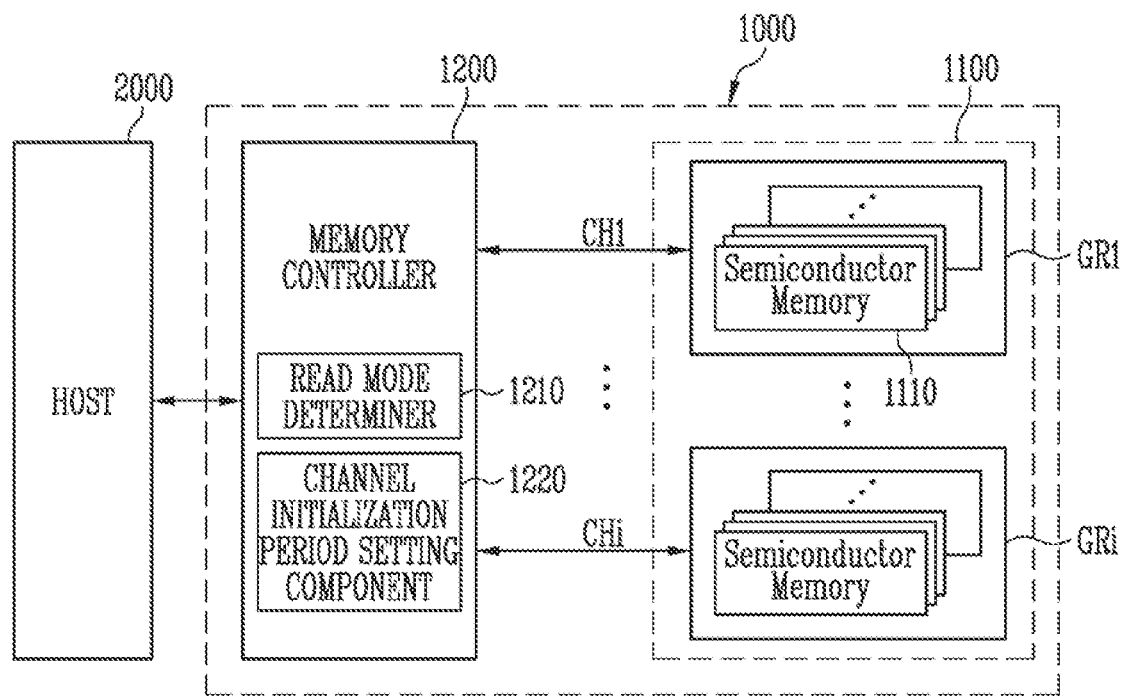
FIG. 8 is a diagram illustrating another embodiment of a memory system.

FIG. 8 is a diagram illustrating another embodiment of a memory system in accordance with the present disclosure.

Referring to FIG. 8, the memory system 1000 includes a memory device 1100 and a memory controller 1200. The memory system 1000 may further include a buffer memory (not shown). The memory device 1100 includes a plurality of semiconductor memories 1110. The plurality of semiconductor memories 1110 may be divided into a plurality of memory groups GR1 to GRi, where I is a positive integer. For example, each of the plurality of semiconductor memories 1110 may be configured as a memory chip.

In FIG. 8, the plurality of memory groups GR1 to GRi communicate with the memory controller 1200 through first to i-th channels CH1 to CHi, respectively. Each of the semiconductor memories 1110 may include a memory cell array 100 in which data is stored, peripheral circuit 200 performing a program operation of storing data in the memory cell array 100, a read operation of outputting the stored data, and an erase operation of erasing the stored data, and a control logic 300 that controls the peripheral circuit 200 under control of the memory controller 1200.

The memory controller 1200 is connected between the host 2000 and the memory device 1100. The memory controller 1200 may access the memory device 1100 in response to a request from the host 2000. For example, the memory controller 1200 may control a background operation such as the read operation, the program operation, the erase operation, or a read reclaim operation of the memory device 1100 in response to the request received from the host 2000. The memory controller 1200 may provide an interface between the memory device 1100 and the host 2000. The memory controller 1200 may drive firmware for controlling the memory device 1100.

The memory controller 1200 may include a read mode determiner 1210 and a channel initialization period setting component 1220. The read mode determiner 1210 determines a read operation mode based on a read command received from the host 2000. For example, when the read command received from the host 2000 is received, the read mode determiner 1210 determines whether the memory device 1100 performs the read operation in a normal read method or the memory device 1100 performs the read operation in an interleave read operation or a cache read operation based on the received read command. For example, the interleave read method is a read method in which read operations of each of the plurality of memory groups GR1 to GRi included in the memory device 1100 are overlapped. For example, the read operation of one semiconductor memory 1110 included in the memory group GR1 and the read operation of one semiconductor memory 1110 included in the memory group GRi may be simultaneously performed or may be performed to be partially overlapped in some periods. In an embodiment, a cache read method of the cache read operation may be performed so that a first operation of reading data stored in the memory cell array and storing the data in the page buffer group of the selected semiconductor memory 1110 during the read operation and an operation of transmitting the data stored in the page buffer group to the memory controller 1200 are simultaneously performed or may be performed so that some periods overlap.

The channel initialization period setting component 1220 sets a time of a channel initialization period of the selected semiconductor memory 1110 based on the read operation mode determined by the read mode determiner 1210. For example, when the read operation of the selected semiconductor memory 1110 is determined as the interleave read method or the cache read method, the channel initialization period setting component 1220 sets the time of the channel initialization period of the selected semiconductor memory 1110 to the first time A as shown in FIG. 7A. On the other hand, when the read operation of the selected semiconductor memory 1110 is determined as the normal read (where normal read means not interleave read and not cache read) operation, the channel initialization period setting component 1220 sets the time of the channel initialization period of the selected semiconductor memory 1110 to the second time B as shown in FIG. 7B.

Among the read operations of the memory device 1100, the interleave read method or the cache read method may consume a larger current amount compared to the normal read operation method. Accordingly, during the read operation of the interleave read method or the cache read method, the channel initialization period may be set to be relatively long as shown in FIG. 7A to improve the read disturb phenomenon. On the other hand, during the read operation of the normal read operation method, the channel initialization period may be set to be relatively short as shown in FIG. 7B to improve an operation speed.

Information on the set channel initialization period may be transmitted to the selected semiconductor memory 1110 of the memory device 1100 during the read operation, and the semiconductor memory 1110 may perform the channel initialization operation of the read operation during the set time based on the information on the channel initialization period.

The memory controller 1200 and the memory device 1100 may be integrated into one semiconductor device. As an exemplary embodiment, the memory controller 1200 and the memory device 1100 may be integrated into one semiconductor device and configure a memory card. For example, the memory controller 1200 and the memory device 1100 may be integrated into one semiconductor device and may configure a memory card such as a PC card (a personal computer memory card international association (PCM-CIA)), a compact flash card (CF), a smart media card (SM or SMC), a memory stick, a multimedia cards (an MMC, an RS-MMC, or an MMCmicro), an SD card (an SD, a miniSD, a microSD, or an SDHC), or a universal flash storage (UFS).

The memory controller 1200 and the memory device 1100 may be integrated into one semiconductor device and may configure a semiconductor drive (solid state drive (SSD)). The semiconductor drive (SSD) includes a storage device storing data in a semiconductor memory. When the memory system 1000 is used as the semiconductor drive (SSD), an operation speed of the host 2000 connected to the memory system 1000 is dramatically improved.

As another example, the memory system 1000 is provided as one of various components of an electronic device such as a computer, an ultra-mobile PC (UMPC), a workstation, a net-book, a personal digital assistants (PDA), a portable computer, a web tablet, a wireless phone, a mobile phone, a smart phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, and a digital video player, a device capable of transmitting and receiving information in a wireless environment, one of various electronic devices configuring a home network, one of various electronic devices configuring a computer network, one of various electronic devices configuring a telematics network, an RFID device, or one of various components configuring a computing system.

As an example of an embodiment, the memory device 1100 or the memory system 1000 may be mounted as a package of various types. For example, the memory device 1100 or the memory system 1000 may be packaged and mounted in a method such as a package on package (PoP), ball grid arrays (BGAs), chip scale packages (CSPs), plastic leaded chip carriers (PLCC), a plastic dual in line package (PDIP), a die in waffle pack, die in wafer form, a chip on board (COB), a ceramic dual in line package (CERDIP), a plastic metric quad flat pack (MQFP), a thin quad flat pack (TQFP), a small outline (SOIC), a shrink small outline package (SSOP), a thin small outline (TSOP), a system in package (SIP), a multi-chip package (MCP), a wafer-level fabricated package (WFP), or a wafer-level processed stack package (WSP).

Figure 9:
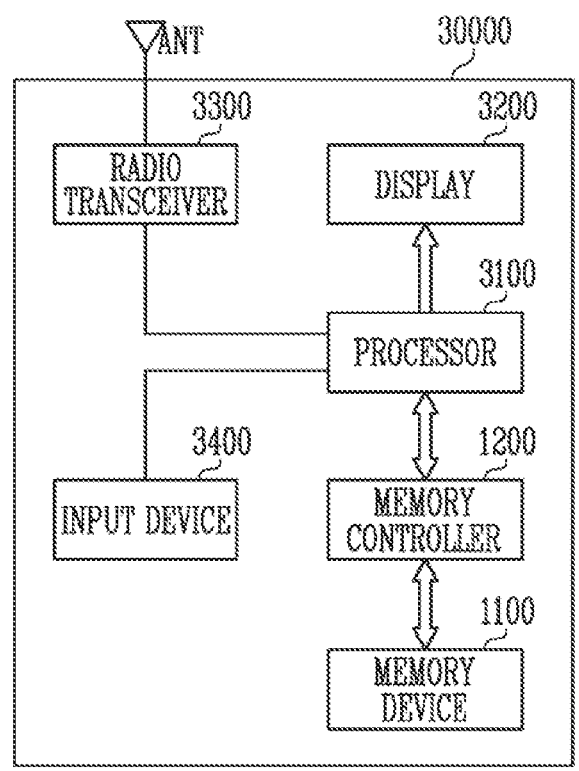
FIG. 9 is a diagram illustrating another embodiment of a memory system including the memory device shown in FIG. 2.

FIG. 9 is a diagram illustrating another embodiment of a memory system including the memory device shown in FIG. 2.

Referring to FIG. 9, the memory system 30000 may be implemented as a cellular phone, a smart phone, a tablet PC, a personal digital assistant (PDA) or a wireless communication device. The memory system 30000 may include the memory device 1100 and the memory controller 1200 capable of controlling the operation of the memory device 1100. The memory controller 1200 may control a data access operation, for example, a program operation, an erase operation, or a read operation, of the memory device 1100 under control of a processor 3100.

Data programmed in the memory device 1100 may be output through a display 3200 under the control of the memory controller 1200.

A radio transceiver 3300 may transmit and receive a radio signal through an antenna ANT. For example, the radio transceiver 3300 may convert a radio signal received through the antenna ANT into a signal that may be processed by the processor 3100. Therefore, the processor 3100 may process the signal output from the radio transceiver 3300 and transmit the processed signal to the memory controller 1200 or the display 3200. The memory controller 1200 may program the signal processed by the processor 3100 to the memory device 1100. In addition, the radio transceiver 3300 may convert a signal output from the processor 3100 into a radio signal, and output the converted radio signal to an external device through the antenna ANT. An input device 3400 may be a device capable of inputting a control signal for controlling the operation of the processor 3100 or data to be processed by the processor 3100. The input device 3400 may be implemented as a pointing device such as a touch pad or a computer mouse, a keypad, or a keyboard. The processor 3100 may control an operation of the display 3200 so that data output from the memory controller 1200, data output from the radio transceiver 3300, or data output from the input device 3400 is output through the display 3200.

According to an embodiment, the memory controller 1200 capable of controlling the operation of memory device 1100 may be implemented as a part of the processor 3100 and may also be implemented as a chip separate from the processor 3100.

Figure 10:
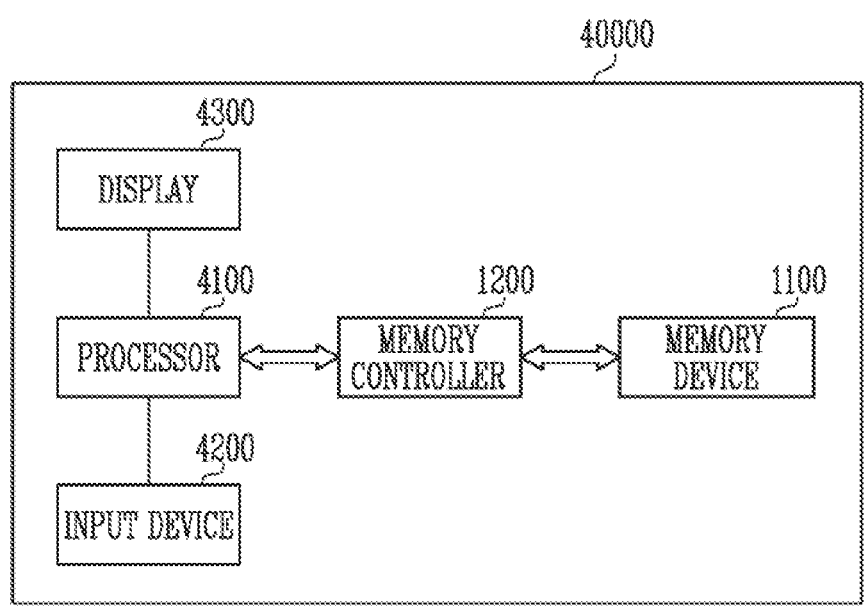
FIG. 10 is a diagram illustrating another embodiment of a memory system including the memory device shown in FIG. 2.

FIG. 10 is a diagram illustrating another embodiment of a memory system including the memory device shown in FIG. 2.

Referring to FIG. 10, the memory system 40000 may be implemented as a personal computer (PC), a tablet PC, a net-book, an e-reader, a personal digital assistant (PDA), a portable multimedia player (PMP), an MP3 player, or an MP4 player.

The memory system 40000 may include the memory device 1100 and the memory controller 1200 capable of controlling a data process operation of the memory device 1100.

A processor 4100 may output data stored in the memory device 1100 through a display 4300, according to data input through an input device 4200. For example, the input device 4200 may be implemented as a point device such as a touch pad or a computer mouse, a keypad, or a keyboard.

The processor 4100 may control the overall operation of the memory system 40000 and control the operation of the memory controller 1200. According to an embodiment, the memory controller 1200 capable of controlling the operation of memory device 1100 may be implemented as a part of the processor 4100 or may be implemented as a chip separate from the processor 4100.

Figure 11:
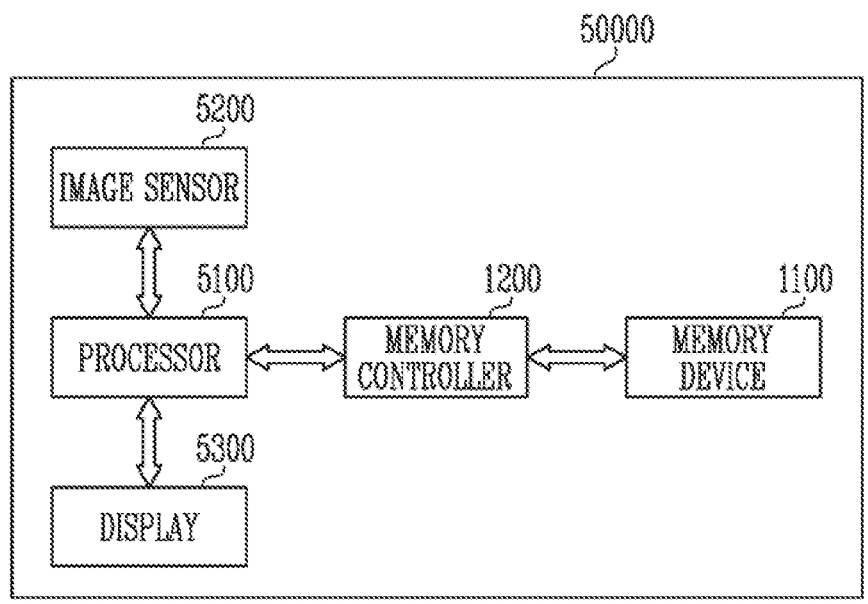
FIG. 11 is a diagram illustrating another embodiment of a memory system including the memory device shown in FIG. 2.

FIG. 11 is a diagram illustrating another embodiment of a memory system including the memory device shown in FIG. 2.

Referring to FIG. 11, the memory system 50000 may be implemented as an image processing device, for example, a digital camera, a portable phone provided with a digital camera, a smart phone provided with a digital camera, or a tablet PC provided with a digital camera.

The memory system 50000 includes the memory device 1100 and the memory controller 1200 capable of controlling a data process operation, for example, a program operation, an erase operation, or a read operation, of the memory device 1100.

An image sensor 5200 of the memory system 50000 may convert an optical image into digital signals. The converted digital signals may be transmitted to a processor 5100 or the memory controller 1200. Under control of the processor 5100, the converted digital signals may be output through a display 5300 or stored in the memory device 1100 through the memory controller 1200. In addition, data stored in the memory device 1100 may be output through the display 5300 under the control of the processor 5100 or the memory controller 1200.

According to an embodiment, the memory controller 1200 capable of controlling the operation of memory device 1100 may be implemented as a part of the processor 5100 or may be implemented as a chip separate from the processor 5100.

Figure 12:
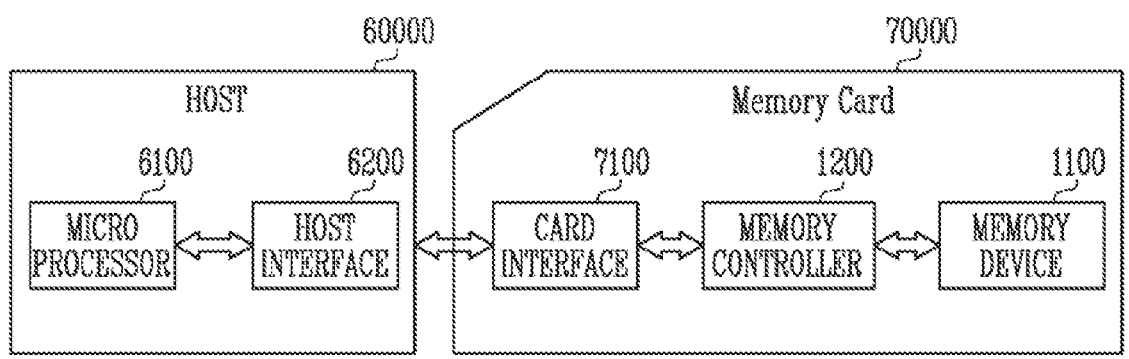
FIG. 12 is a diagram illustrating another embodiment of a memory system including the memory device shown in FIG. 2.

FIG. 12 is a diagram illustrating another embodiment of a memory system including the memory device shown in FIG. 2.

Referring to FIG. 12, the memory system 70000 may be implemented as a memory card or a smart card. The memory system 70000 may include the memory device 1100, the memory controller 1200, and a card interface 7100.

The memory controller 1200 may control data exchange between the memory device 1100 and the card interface 7100. According to an embodiment, the card interface 7100 may be a secure digital (SD) card interface or a multi-media card (MMC) interface, but is not limited thereto.

The card interface 7100 may interface data exchange between a host 60000 and the memory controller 1200 according to a protocol of the host 60000. According to an embodiment, the card interface 7100 may support a universal serial bus (USB) protocol, and an interchip (IC)-USB protocol. Here, the card interface may refer to hardware capable of supporting a protocol that is used by the host 60000, software installed in the hardware, or a signal transmission method.

When the memory system 70000 is connected to a host interface 6200 of the host 60000 such as a PC, a tablet PC, a digital camera, a digital audio player, a mobile phone, a console video game hardware, or a digital set-top box, the host interface 6200 may perform data communication with the memory device 1100 through the card interface 7100 and the memory controller 1200 under control of a microprocessor 6100.

Although the detailed description of the present disclosure describes specific embodiments, various changes and modifications are possible without departing from the scope and technical spirit of the present disclosure. Therefore, the scope of the present disclosure should not be limited to the above-described embodiments, and should be determined by the equivalents of the claims of the present disclosure as well as the following claims.

Although the present disclosure has been described with reference to the limited embodiments and drawings, the present disclosure is not limited to the embodiments described above, and various changes and modifications may be made from the disclosed description by those skilled in the art to which the present disclosure pertains.

What is claimed is:

1. A memory device comprising:
a memory cell array including a plurality of planes;
a peripheral circuit configured to perform a read operation including a channel initialization operation on a selected memory block among a plurality of memory blocks included in each of the plurality of planes, wherein the channel initialization operation is performed to remove hot holes remaining in a channel of the selected memory block; and
control logic configured to control the peripheral circuit to perform the read operation including the channel initialization operation,
wherein the control logic determines whether a single plane read operation or a multi-plane read operation is performed based on a read mode of the read operation, and sets an activation time of the channel initialization operation of the read operation according to a determination result, and
wherein in the single plane read operation, one plane is selected among the plurality of planes and the single read operation is performed thereon, and in the multi-plane read operation, at least two planes are selected together among the plurality of planes and the multi-read read operation is performed thereon, and read operation periods corresponding to the at least two planes overlap each other during the multi-plane read operation.

2. The memory device of claim 1,
wherein when the read operation is the multi-plane read operation, the control logic sets the activation time of the channel initialization operation to a first time, and when the read operation is the single plane read operation, the control logic sets the activation time of the channel initialization operation to a second time shorter than the first time.

3. The memory device of claim 2,
wherein when the read operation is the multi-plane read operation, the first time is set to be increased as the number of planes selected from among the plurality of planes increases during the read operation.

4. The memory device of claim 1, wherein the control logic comprises:
an operation mode determination circuit configured to determine the read mode based on a command received externally from the memory device; and
a channel initialization period setting circuit configured to set the activation time of the channel initialization operation based on a determination result of the operation mode determination circuit.

5. The memory device of claim 1,
wherein the channel initialization operation is an operation of electrically connecting the channel and a source line of the selected memory block by applying a turn-on voltage to word lines and select lines of the selected memory block.

6. The memory device of claim 5,
wherein a read voltage and a pass voltage are applied to the word lines of the selected memory block after the channel initialization operation.

7. The memory device of claim 6, wherein the peripheral circuit comprises:
a voltage generation circuit configured to generate the turn-on voltage, the read voltage, and the pass voltage; and
a row decoder configured to selectively apply the turn-on voltage, the read voltage, and the pass voltage to the select lines and the word lines of the selected memory block.

8. A method of operating a memory device, the method comprising:
determining a read mode of a read operation based on a command received externally from the memory device;
setting an activation time of a channel initialization operation based on the determined read mode;
performing the channel initialization operation to remove hot holes remaining in a channel of a selected memory block during the activation time; and
applying a read voltage to the selected memory block after performing the channel initialization operation,
wherein determining the read mode comprises determining whether the command corresponds to a single plane read operation or a multi-plane read operation, and
wherein in the single plane read operation, one plane is selected among the plurality of planes and the single read operation is performed thereon, and in the multi-plane read operation, at least two planes are selected together among the plurality of planes and multi—the read operation is performed thereon, and read operation periods corresponding to the at least two planes overlap each other during the multi-plane read operation.

9. The method of claim 8,
wherein setting the activation time of the channel initialization operation comprises setting the activation time to a first time when the command corresponds to the multi-plane read operation, and setting the activation time to a second time shorter than the first time when the command corresponds to the single plane read operation.

10. The method of claim 9,
wherein when the command corresponds to the multi-plane read operation, as the number of planes selected during the read operation increases, the first time is increased and set.

11. Method of claim 8,
wherein the channel and a source line of the selected memory block are electrically connected by applying a turn-on voltage to word lines and select lines of the selected memory block during the channel initialization operation.

12. A memory system comprising:
a memory device including a plurality of semiconductor memories; and
a memory controller configured to control a read operation of the memory device based on a read command received externally from the memory system,
wherein the memory controller determines whether the read operation is an interleave read operation, a cache read operation, or a normal read operation, where the normal read operation is different from the interleave read operation or the cache read operation, based on the read command, and sets an activation time of a channel initialization operation of the read operation according to a determination result,
wherein when the read operation is determined as the interleave read operation or the cache read operation, the memory controller sets the activation time of the channel initialization operation to a first time, and
when the read operation is determined as the normal read operation, the activation time of the channel initialization operation is set to a second time shorter than the first time.

13. The memory system of claim 12,
wherein a semiconductor memory selected during the read operation among the plurality of semiconductor memories included in the memory device electrically connects a channel and a source line of a selected memory block by applying turn-on voltage to word lines and select lines of the selected memory block during the channel initialization operation.

* * * * *